US009797576B2

(12) United States Patent
Matsubayashi et al.

(10) Patent No.: US 9,797,576 B2
(45) Date of Patent: Oct. 24, 2017

(54) LUMINAIRE

(71) Applicant: PANASONIC INTELLECTUAL PROPERTY MANAGEMENT CO., LTD., Osaka (JP)

(72) Inventors: Yoko Matsubayashi, Osaka (JP); Tohru Himeno, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 184 days.

(21) Appl. No.: 14/848,420

(22) Filed: Sep. 9, 2015

(65) Prior Publication Data
US 2016/0076709 A1 Mar. 17, 2016

(30) Foreign Application Priority Data

Sep. 12, 2014 (JP) .................. 2014-186253

(51) Int. Cl.
| *F21V 9/16* | (2006.01) |
| *H01L 33/50* | (2010.01) |
| *F21Y 113/13* | (2016.01) |
| *H01L 25/075* | (2006.01) |
| *F21Y 115/10* | (2016.01) |

(52) U.S. Cl.
CPC .............. *F21V 9/16* (2013.01); *H01L 33/504* (2013.01); *F21Y 2113/13* (2016.08); *F21Y 2115/10* (2016.08); *H01L 25/0753* (2013.01)

(58) Field of Classification Search
CPC ..... F21V 9/16; F21V 9/00; F21V 1/00; F21V 9/02; F21V 9/08; F21V 9/10; F21V 13/00; H01L 33/504; H01L 25/0753; F21Y 2115/10; F21Y 2115/15; F21Y 2115/20; F21Y 2113/10; F21Y 2113/13; F21Y 2113/17
See application file for complete search history.

(56) References Cited

U.S. PATENT DOCUMENTS

| 9,062,851 | B2 | 6/2015 | Matsubayashi et al. |
| 9,163,790 | B2 | 10/2015 | Ogata et al. |
| 9,488,333 | B2* | 11/2016 | Matsubayashi .... H05B 33/0857 |
| 2007/0291467 | A1* | 12/2007 | Nagai .................. H05B 33/086 362/84 |
| 2009/0058250 | A1* | 3/2009 | Sin .......................... H01J 11/10 313/112 |
| 2009/0243467 | A1* | 10/2009 | Shimizu .............. C09K 11/7734 313/503 |
| 2010/0277054 | A1* | 11/2010 | Takashima ........... C09K 11/662 313/483 |

(Continued)

FOREIGN PATENT DOCUMENTS

| JP | 2001-184910 | 7/2001 |
| JP | 2010-162214 | 7/2010 |

(Continued)

*Primary Examiner* — Bao Q Truong
(74) *Attorney, Agent, or Firm* — Greenblum & Bernstein, P.L.C.

(57) ABSTRACT

A luminaire includes a light source unit. The light source unit is configured to irradiate light having a correlated color temperature between 2600 K and 4500 K, a chromaticity deviation Duv between −1.6 and −12, and a general color rendering index Ra of 80 or more.

15 Claims, 15 Drawing Sheets

(56) References Cited

U.S. PATENT DOCUMENTS

2011/0182072 A1* 7/2011 Shimizu ............. C09K 11/7739
                                                        362/293
2012/0112626 A1   5/2012 Sakuta et al.
2013/0300282 A1  11/2013 Mori et al.
2014/0077694 A1*  3/2014 Matsumoto ........... H01J 61/125
                                                        313/638

FOREIGN PATENT DOCUMENTS

| JP | 2012-56970  | 3/2012 |
| JP | 2013-127853 | 6/2013 |
| JP | 2014-075186 | 4/2014 |
| WO | 2012-104937 | 8/2012 |

* cited by examiner

FIG.4A

| 3000K | -15 | -12 | -9 | -6 | -3 | 0 | 3 | 6 |
|---|---|---|---|---|---|---|---|---|
| LEGIBILITY | | | ○ | | | | | ✕ |
| WHITENESS | | | | ○ | | | | ✕ |
| PREFERENCE | | | | ○ | | | | ✕ |

FIG.4B

| 3000K | -15 | -12 | -9 | -6 | -3 | 0 | 3 | 6 |
|---|---|---|---|---|---|---|---|---|
| LEGIBILITY | | | | ○ | | | | ✕ |
| WHITENESS | | | | ○ | | | | ✕ |
| PREFERENCE | | | | ○ | | | | ✕ |

FIG.4C

| 3000K | -15 | -12 | -9 | -6 | -3 | 0 | 3 | 6 |
|---|---|---|---|---|---|---|---|---|
| LEGIBILITY | | | | | ○ | | | ✕ |
| WHITENESS | | | | | ○ | | | ✕ |
| PREFERENCE | | | | | ○ | | | ✕ |

FIG.4D

| 3000K | -15 | -12 | -9 | -6 | -3 | 0 | 3 | 6 |
|---|---|---|---|---|---|---|---|---|
| LEGIBILITY | ✕ |  |  | ○ |  |  |  |  |
| WHITENESS | ✕ |  |  | ○ |  |  |  |  |
| PREFERENCE | ✕ |  |  |  | ○ |  |  |  |

FIG.4E

| 3000K | -15 | -12 | -9 | -6 | -3 | 0 | 3 | 6 |
|---|---|---|---|---|---|---|---|---|
| LEGIBILITY | ✕ |  |  | ○ |  |  |  |  |
| WHITENESS | ✕ |  |  |  | ○ |  |  |  |
| PREFERENCE | ✕ |  |  |  | ○ |  |  |  |

LUMINAIRE

CROSS-REFERENCE TO RELATED APPLICATION

This application claims the benefit of priority of Japanese Patent Application No. 2014-186253, filed on Sep. 12, 2014, the entire contents of which are hereby incorporated by reference.

TECHNICAL FIELD

The present disclosure relates to a luminaire having light-emitting diodes (LEDs) as a light source, and more particularly to a technology for improving legibility of characters in a low color temperature environment where a correlated color temperature is 4500 K or less.

BACKGROUND ART

Conventionally, the develop of a luminaire has a purpose of faithfully reproducing an original color of a target object to be illuminated. Specifically, it is considered better as the colors of various target objects are seen closer to the colors seen under the standard light. This makes it possible to objectively evaluate a luminaire by using a general color rendering index.

However, the general color rendering index is not necessarily sufficient as an indicator for evaluating the appearance of characters written on a paper. Accordingly, as the indicator that quantitatively requires the white color sense of a paper from a correlation between the appearance of characters and the white color sense, there is used a chroma value acquired by using a calculation method by the CIE 1997 Interim Color Appearance Model (Simple Version). As for a luminaire for irradiating light with a chroma value controlled, there is known a luminaire using an LED light source irradiating light having a correlated color temperature of 5400 to 7000 K (see, e.g., Japanese Unexamined Patent Application Publication No. 2014-75186).

However, when the luminaire described above is used as a task lamp under a low color temperature environment, a user may feel a sense of discomfort due to the great difference of the correlated color temperature between task lamp light and ambient (environment) lamp light.

SUMMARY OF THE INVENTION

In view of the above, the present disclosure provides a luminaire which can irradiate illumination light which makes a user hardly feel a sense of discomfort and characters easily legible.

In accordance with an aspect of the present invention, there is provided a luminaire including a light source unit configured to irradiate light having a correlated color temperature between 2600 K and 4500 K, a chromaticity deviation Duv between −1.6 and −12, and a general color rendering index Ra of 80 or more.

In accordance with a present disclosure, the illumination light has a low correlated color temperature and has an effect of making a paper on which characters are written look white. Therefore, when the luminaire is used in a low color temperature environment, the luminaire can irradiate illumination light in which a user hardly feels a sense of discomfort and characters are easily legible.

BRIEF DESCRIPTION OF THE DRAWINGS

The figures depict one or more implementations in accordance with the present teaching, by way of example only, not by way of limitations. In the figures, like reference numerals refer to the same or similar elements.

FIGS. 4A to 4E are views showing result of evaluation on legibility, whiteness of a paper, and preference under task lamp light having various correlated color temperatures.

DETAILED DESCRIPTION

Figure 1:
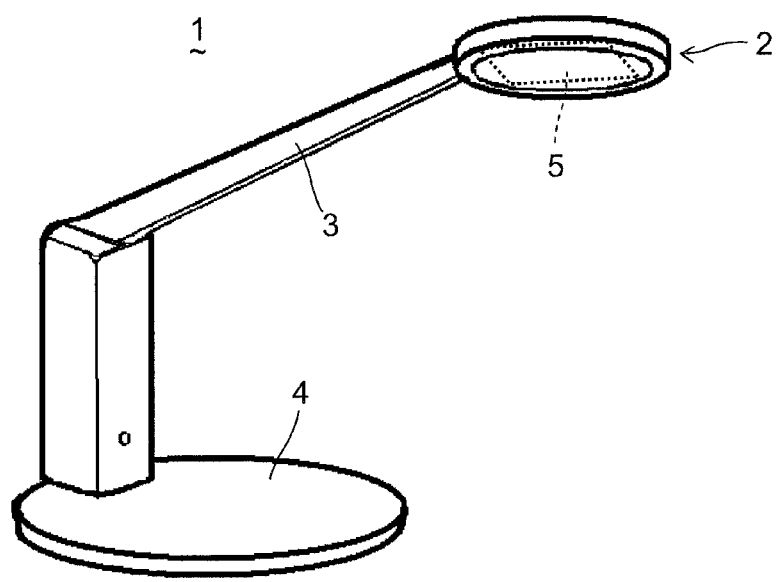
FIG. 1 is a perspective view of a luminaire in accordance with an embodiment.

Hereinafter, a luminaire in accordance with an embodiment will be described with reference to the drawings. As shown in FIG. 1, a luminaire 1 is, e.g., a stand-alone lamp used on a desk and the like. The luminaire 1 includes a flat plate-shaped lamp device 2 which emits light, an arm 3 which supports the lamp device 2 to be movable, and a base 4 which axially supports the arm 3 and is put on a desk or the like. The lamp device 2 has a light-emitting surface from which light is emitted, and a light source unit 5.

Figure 2A:
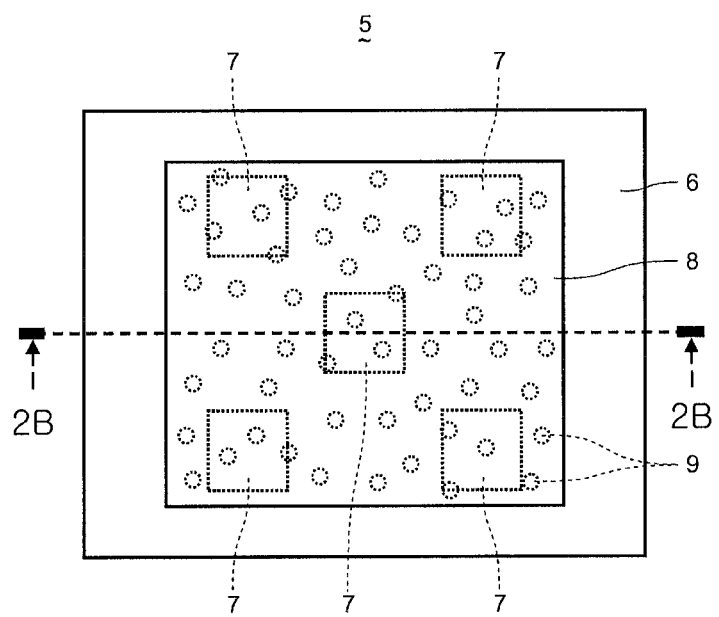
FIG. 2A is a top view of a light source unit included in the luminaire.
Figure 2B:
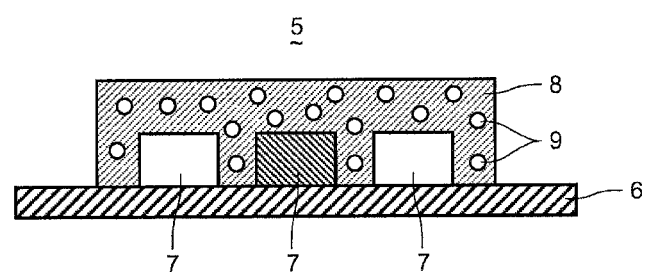
FIG. 2B is a cross-sectional view taken along a line 2B-2B of FIG. 2A.

As shown in FIGS. 2A and 2B, the light source unit 5 includes a wiring substrate 6, a plurality of LEDs 7 installed on one surface of the wiring substrate 6, a light-transmitting member 8 which encapsulates the LEDs 7, and fluorescent substances 9 which are dispersed in the light-transmitting member 8 to convert a wavelength of the light.

The LEDs 7 include, e.g., gallium nitride-based LEDs and blue LEDs which emit blue light. The blue light has a main peak wavelength in a wavelength band, e.g., between 380 and 500 nm. The light-transmitting member 8 is made of, e.g., a silicon resin. All the LEDs 7 are encapsulated in the example shown in FIGS. 2A and 2B, but only some of the LEDs 7 may be encapsulated. The fluorescent substances 9 are formed of at least two fluorescent substances among cyan fluorescent substances, green/yellow fluorescent substances, and red fluorescent substances, which are excited by blue light.

The cyan fluorescent substances convert the blue light from the LEDs 7 into the cyan light having a main peak wavelength in a wavelength band between 470 and 500 nm. The green/yellow fluorescent substances convert the blue light from the LEDs 7 into the green to yellow light having a main peak wavelength in a wavelength band between 500 and 595 nm. Generally, a green fluorescent substance emits light having a main peak wavelength in a wavelength band between 500 and 545 nm. A yellow fluorescent substance emits light having a main peak wavelength in a wavelength band between 545 and 595 nm. However, the fluorescent substances have large characteristic differences therebetween. Further, although a fluorescent substance is classified as a yellow fluorescent substance according to a composition formula, it may be classified as a green fluorescent substance according to a radiation light wavelength, and vice versa. Accordingly, it is difficult to clearly distinguish between a green fluorescent substance and a yellow fluorescent substance. For this reason, in the present disclosure, the green fluorescent substance and the yellow fluorescent substance are not clearly distinguished from each other, so that the two fluorescent substances are indicated as "green/yellow fluorescent substance". The red fluorescent substances convert at least one of the blue light from the blue LEDs and the green to yellow light from the green/yellow fluorescent substances into red light having a main peak wavelength in a wavelength band between 600 and 650 nm.

The cyan fluorescent substance and the green fluorescent substance are composed of, e.g., $Y_3Al_5O_{12}:Ce^{3+}$, $Tb_3Al_5O_{12}:Ce^{3+}$, $BaY_2SiAl_4O_{12}:Ce^{3+}$, $Ca_3Sc_2Si_3O_{12}:Ce^{3+}$, $(Ba, Sr)_2SiO_4:Eu^{2+}$, $CaSc_2O_4:Ce^{3+}$, $Ba_3Si_6O_{12}N_4:Eu^{2+}$, $\beta\text{-SiAlON}:Eu^{2+}$, or $SrGa_2S_4:Eu^{2+}$. The yellow fluorescent substance is composed of, e.g., $(Y, Gd)3Al5O12:Ce^{3+}$, $Y_3Al_5O_{12}:Ce^{3+}, Pr^{3-}$, $(Tb, Gd)_3Al_5O_{12}:Ce^{3+}$, $(Sr, Ba)_2SiO_4:Eu^{2+}$, $(Sr, Ca)_2SiO_4:Eu^{2+}$, $CaSi_2O_2N_2:Eu^{2+}$, $Ca\text{-}\alpha\text{-SiAlON}:Eu^{2+}$, $Y_2Si_4N_6C:Ce^{3+}$, or $CaGa_2S_4:Eu^{2+}$. The red fluorescent substance is composed of, e.g., $Ca\text{-}\alpha\text{-SiAlON}:Eu^{2+}$, $CaAlSiN_3:Eu^{2+}$, $(Sr, Ca)AlSiN_3:Eu^{2+}$, $Sr_2Si_5N_8:Eu^{2+}$, $Sr_2(Si, Al)_5(N, O)_8:Eu^{2+}$, $CaS:Eu^{2+}$, or $La_2O_2S:Eu^{3+}$.

In a test, light having a low correlated color temperature of 4500 K or less was irradiated from the luminaire 1 configured as above and it was verified that how easily the characters written on a paper are recognized depending on how to control the chromaticity deviation Duv.

In this test, reference light and test light were irradiated at an illuminance of 500 lx and each of the correlated color temperatures of 3000 K, 3500 K, 4000 k, 5000 K and 6200 K. Under each condition, legibility of the characters was verified by subjects. Duv of the reference light was set to 0 with respect to each of the correlated color temperatures. Duv of the test light was set to 3, −3, −6, −9, −12 and −15 in a case where the correlated color temperature is equal to or less than 4000 K, and to 6, 3, −3, −6, −9 and −12 in a case where the correlated color temperature is equal to or greater than 5000K. Such reference light and test light were generated by combining a xenon lamp with a liquid crystal filter and adjusting optical characteristics of light irradiated from the xenon lamp by using the liquid crystal filter. The characters read by the subjects were 30 letters cited from MNREAD acuity chart (MNREAD-J) and were printed at a size of 7 points in a center of the common plain copy paper. The subjects were 12 males and females aged 24 to 51 years.

In the test, the subjects were made to read the characters for 5 seconds under the reference light after they adapted to the reference light for 3 minutes, and then the subjects were made to read the characters for 5 seconds under the test light after they adapted to the test light for 40 seconds. In this manner, legibility was evaluated. After performing the above initial evaluation, the subjects were made to adapt to the reference light for 40 seconds and to read the characters for 10 seconds under the reference light, and then, the subjects were made to adapt to the test light for 40 seconds and to read the characters for 5 seconds under the test light. These processes after the initial evaluation were repeated. The evaluation was performed as subjective evaluation which includes color-naming method (absolute evaluation method) and magnitude estimation method (relative effect method). In the color-naming method, legibility was evaluated under the test light by distinguishing the appearance of a paper on which the characters are written by "whiteness" and "tone". In the magnitude estimation method, the characters under the reference light and the characters under the test light were compared on a pair basis.

In the color-naming method, the subjects distinguished the appearance of a paper under the reference light and the test light by "whiteness" and "tone" such that the sum of proportions of "whiteness" and "tone" becomes 100. Thereafter, if the tone was felt, the color was selected between two things: "yellow to green" and "reddish purple to bluish purple". When the "yellow to green" was selected, the numerical value of the tone was set to positive, and when the "reddish purple to bluish purple" was selected, the numerical value of the tone was set to negative.

Figure 3:
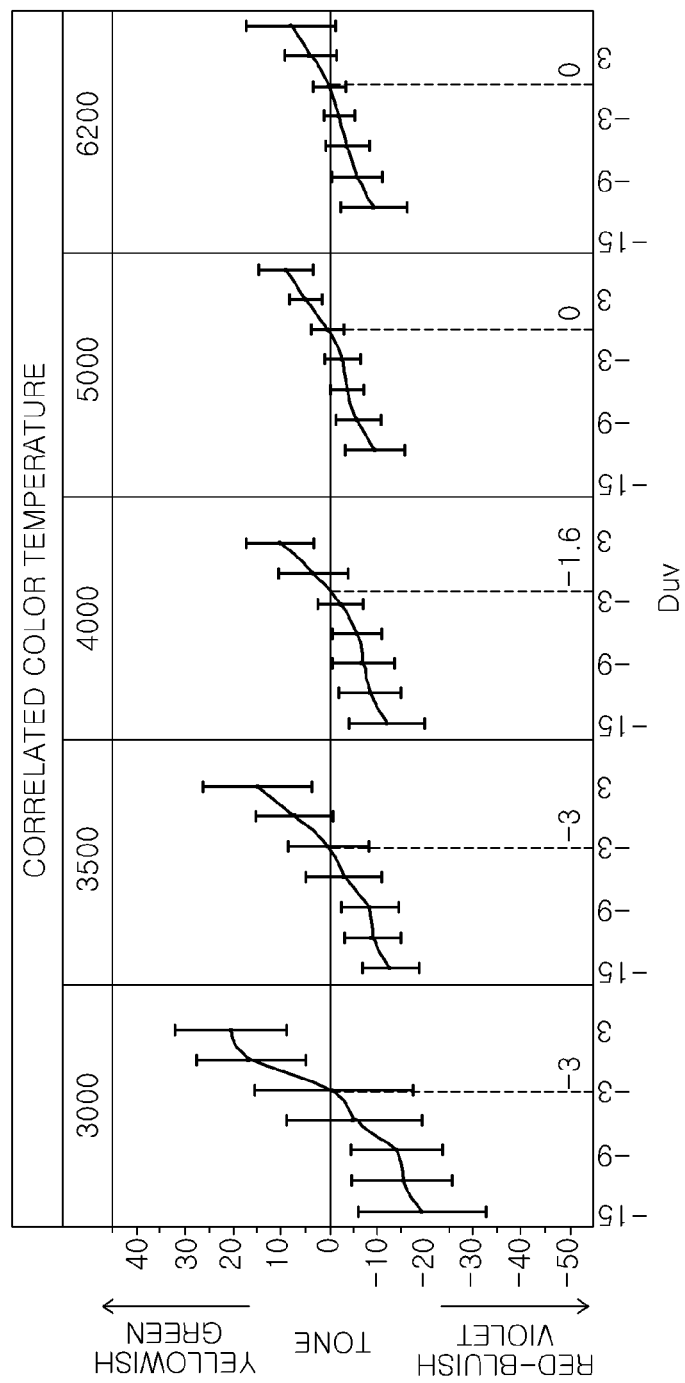
FIG. 3 is a view showing a relationship between chromaticity deviation Duv and a tone of a paper under task lamp light having various correlated color temperatures.

As a result, as shown in FIG. 3, it has been found that when the correlated color temperature of both the reference light and the test light is 3000 K, if Duv of the lights is set to −3, the tone becomes zero, so that the subjects recognize the paper as white color. It has also been found that if Duv of the lights is set to greater than −3, the tone of yellowish green increases, and on the contrary, if Duv of the lights is set to less than −3, the tone of red-bluish violet increases. Similar change tendency was observed on the other correlated color temperatures. However, as the correlated color temperature became lower, a change width of the tone more increased and effect of the white tone due to Duv became stronger.

Further, it has been found that when the correlated color temperature of both the reference light and the test light is 3500K, 4000K, 5000K and 6200 K, if Duv is set to −3, 1.6, 0, 0, respectively, the tone becomes zero. As such, Duv at which the tone is zero varied depending on the correlated color temperature.

On the other hand, in the magnitude estimation method, a degree of legibility of characters under the reference light was set to 100. If the characters under the test light are more legible than under the reference light, the "legibility" was evaluated as a numerical value larger than 100, and if the characters under the test light are less legible than under the reference light, the "legibility" was evaluated as a numerical value smaller than 100. In a similar way, under the reference light and the test light, "whiteness" of a paper and "preference" of a paper appearance were evaluated.

As a result, as shown in FIG. 4A, when the correlated color temperature of both the reference light and the test light was 3000 K, the "legibility" was highest at Duv −9 (indicated by a circle) and there was no significant difference between the case of Duv being −9 and the cases of Duv being −3, −6 and −12 (indicated by dots). Further, the "whiteness" of a paper and "preference" of a paper appearance were highest at Duv −6, and there was no significant difference between the case of Duv being −6 and the cases of Duv being −3, −9 and −12.

As shown in FIG. 4B, when the correlated color temperature was 3500 K, the "legibility", "whiteness" and "preference" all were highest at Duv −6. As shown in FIG. 4C, when the correlated color temperature was 4000 K, the "legibility", "whiteness" and "preference" all were highest at Duv −3. As shown in FIG. 4D, when the correlated color temperature was 5000 K, the "legibility" and "whiteness" were highest at Duv −6, and the "preference" was highest at Duv −3. As shown in FIG. 4E, when the correlated color temperature was 6200 K, the "legibility" was highest at Duv −6, and the "whiteness" and "preference" were highest at Duv −3.

Figure 5:
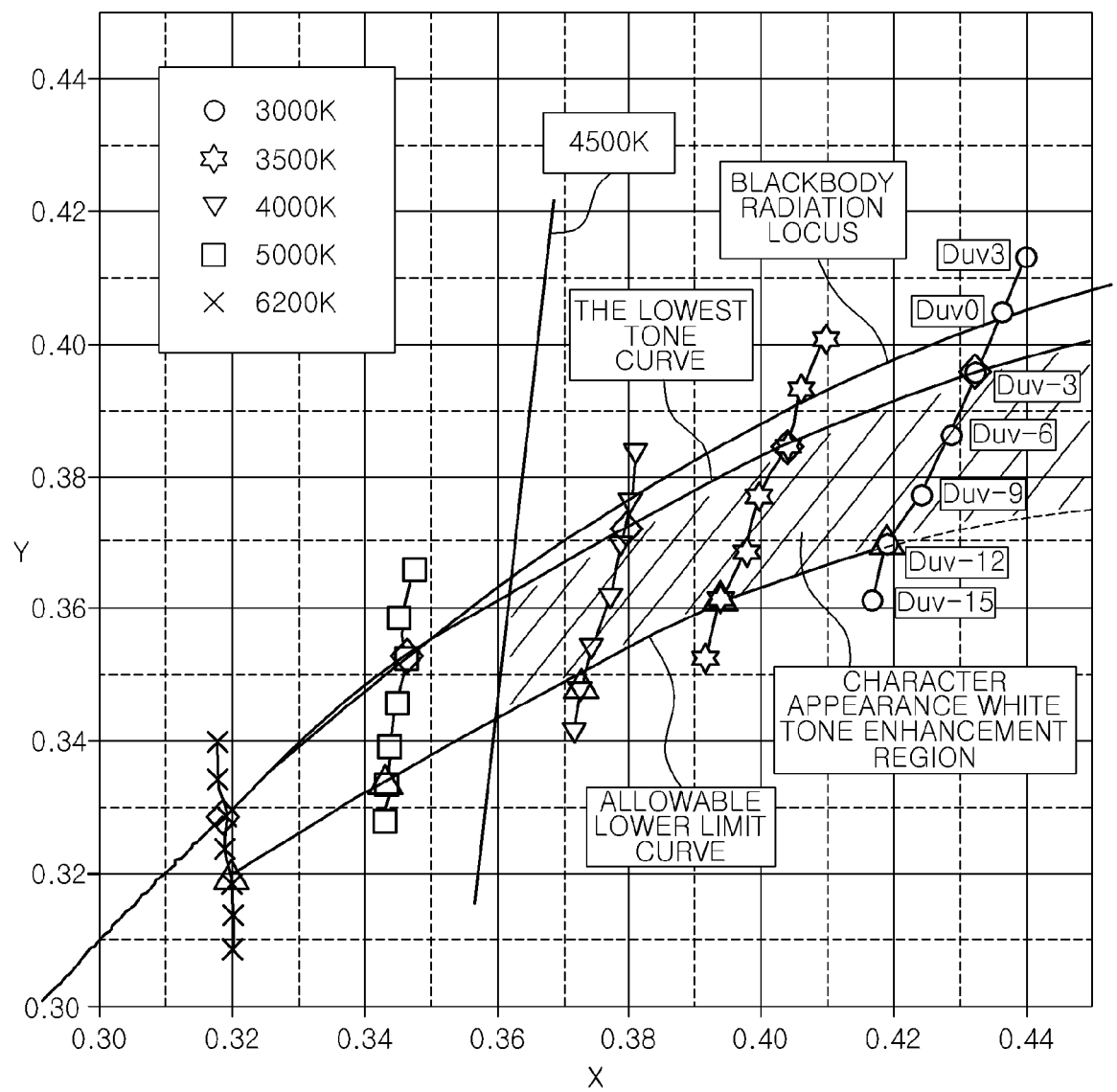
FIG. 5 is a view showing a relation between a color of a paper and legibility or the like in an xy chromaticity diagram.

FIG. 5 is a graph in which results evaluated by the color-naming method and the magnitude estimation method described above are shown in an overlapping manner in an xy chromaticity diagram. For example, when the correlated color temperature of the reference light and the test light is 3000 K (indicated by a circle), marks corresponding to Duv 3, 0, −3, −6, −9, −12 and −15 are plotted from above in the chromaticity diagram in that order. Among those, the mark of Duv −3 has a diamond shape indicating that the tone of a paper is zero in the color nomenclature (see FIG. 3). From the magnitude estimation method (see FIG. 4A), it was already known that there was no significant difference between the case of Duv being −3 and the cases of Duv being −6, −9, and −12 with respect to all the "legibility", "whiteness" and "preference". However, Duv −12, which is the lowest Duv in those having no significant difference, is plotted by a triangle mark. Similarly, for each of the other correlated color temperatures, a diamond mark and a triangle mark are plotted.

The diamond marks for the respective correlated color temperatures are connected by a line, and this line is referred to as "the lowest tone curve" which indicates that it is difficult to recognize the tone of a paper. It is seen that as the correlated color temperature decreases, the lowest tone curve grows away from the blackbody radiation locus toward negative direction. A line connecting the triangle marks for the respective correlated color temperatures to each other is referred to as "allowable lower limit curve" which indicates a lower limit that can obtain the same effect as the diamond marks on the lowest tone curve. A region (indicated by oblique lines) surrounded by the lowest tone curve, the allowable lower limit curve, and a line indicating the correlated color temperature of 4500 K is referred to as "character appearance white tone enhancement region" in which the characters are easily legible and the white color of a paper is easily recognized in a low color temperature environment.

Next, a test was performed to examine the relationships among the correlated color temperature, illuminance and a change in pupil diameter of a subject. In this test, as a light source, white LEDs emitting white light of Duv −3 at the correlated color temperature of 3000 K and blue LEDs emitting blue light having a peak wavelength at 480 nm are used together. The illuminance was set to 5 levels of 300 lx, 500 lx, 750 lx, 1000 lx and 1500 lx. The correlated color temperature was set to 5 levels of 3000 K, 3500 K, 4000 K, 5000 K and 6200 K.

In the test, under illumination light having a predetermined illuminance and a predetermined correlated color temperature, two subjects in their twenties and forties were made to put their chins on chin rests and stare at a black spot having a diameter of 4 mm from a sight distance of 45 cm. In this state, the diameters of pupils of the subjects were measured three times. The pupil diameter was measured by using an eye mark recorder (EMR-9) of a cap type produced by NAC Image Technology, Inc. First, the illuminance was set to 300 lx, and the subjects were adapted to a light having the correlated color temperature of 3000 K for 3 minutes. Then, the pupil diameters of the subjects were measured for 15 seconds. Next, for each of lights having the correlated color temperatures of 3500 K, 4000 K, 5000 K and 6200 K, in this sequence, the subjects were adapted to the light for 1 minute and the pupil diameters were measured for 15 seconds. Thereafter, with respect to the illuminances of 500 lx, 750 lx, 1000 lx and 1500 lx, the pupil diameters were measured about each correlated color temperature in the same manner as the case of illuminance of 300 lx.

Figure 6A:
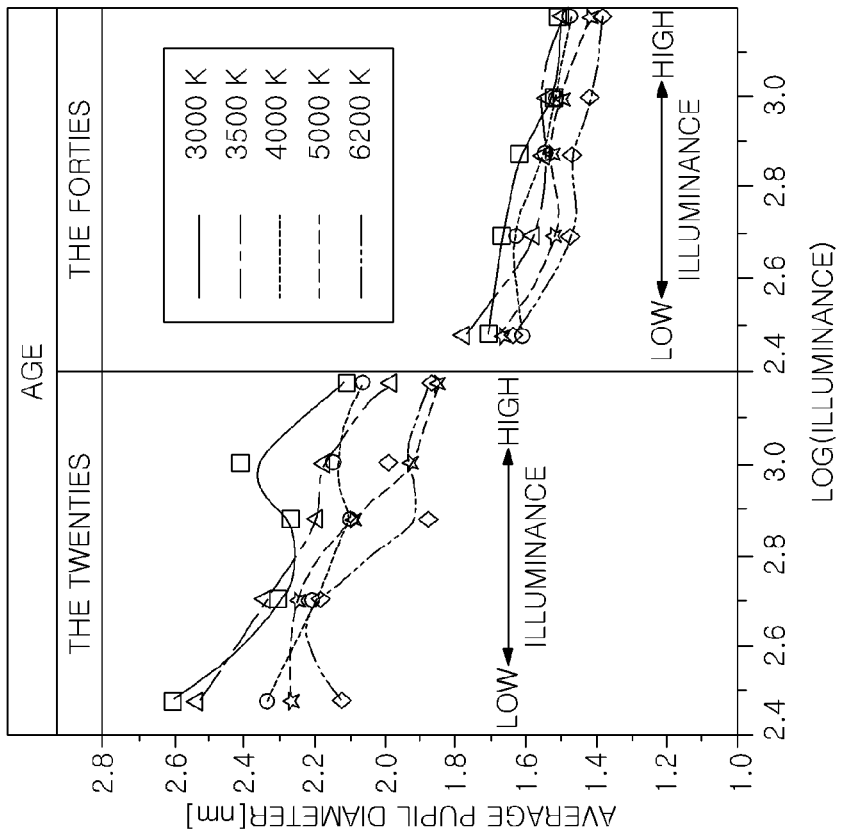
FIGS. 6A and 6B are views showing average pupil diameters of subjects under light having various correlated color temperatures and illuminances.

On the graph of FIG. 6A, an average pupil diameter is plotted about the mired ($10^6$ times the reciprocal of the correlated color temperature). On the graph of FIG. 6B, the average pupil diameter is plotted about the logarithmic value of the illuminance. The average pupil diameter was calculated as an average value in a section ranging from 5 to 10 seconds when the start time of the measurement is 0 second, after filtering by a moving median value of 10 points back and forth (total 21 points), except the measurement errors such as the blink. As a result, it has been found that the average pupil diameter decreases as the correlated color temperature increases and also as the illuminance increases.

Figure 7:
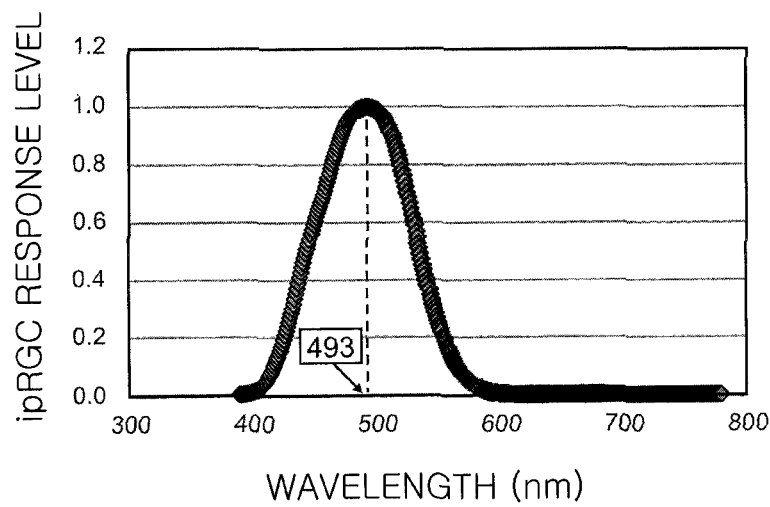
FIG. 7 is a view showing a spectrum sensitivity curve of intrinsic photosensitive retinal ganglion cells (ipRGCs).

As the visual cells related to the adjustment of the pupil diameter, there are known intrinsic photosensitive retinal ganglion cells (ipRGCs). The ipRGCs are a third class of photoreceptors following the pyramidal cells and the rod cells. As shown in FIG. 7, it is known that the ipRGCs respond most efficiently to light having a wavelength of 493 nm.

Figure 8:
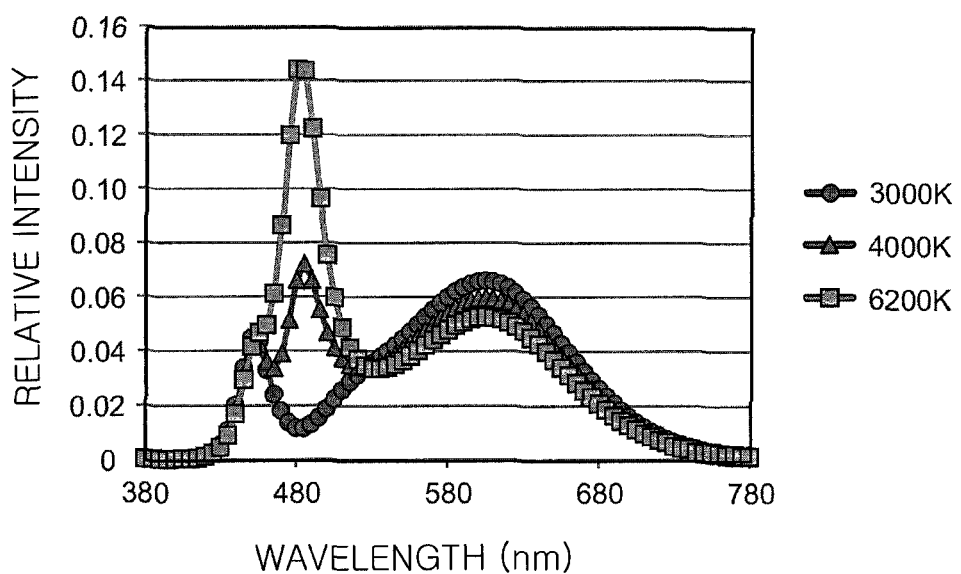
FIG. 8 is a spectrum distribution diagram of light having various correlated color temperatures.

FIG. 8 shows a spectrum distribution curve of light having the correlated color temperature of 3000 K, 4000 K and 6200 K used in this test. The light having the correlated color temperature of 6200 K includes considerable amount of light having wavelength of 493 nm, whereas the light having the correlated color temperature of 3000 K includes little amount of light having wavelength of 493 nm. An integrated value of the spectrum distribution curve and an ipRGC response level was calculated and a stimulus level of the ipRGC by the light of each correlated color temperature was obtained. The ipRGC stimulus level was standardized by setting an ipRGC stimulus level by light emitted from a standard light source D65 (at the illuminance of 1000 lx) to 100.

Figure 6B:
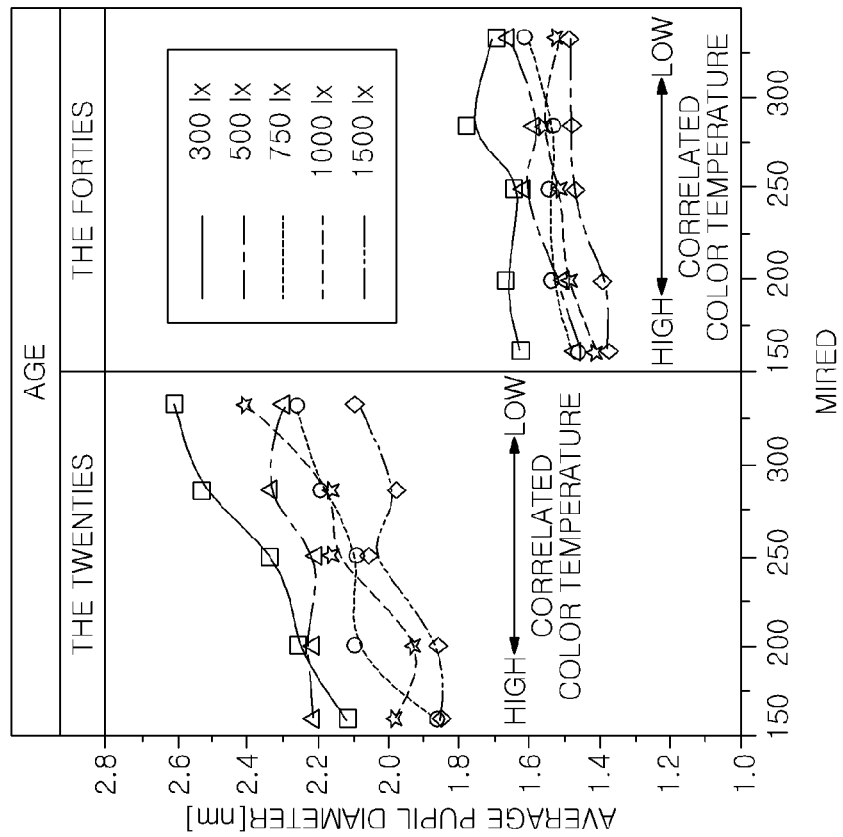
Figure 9:
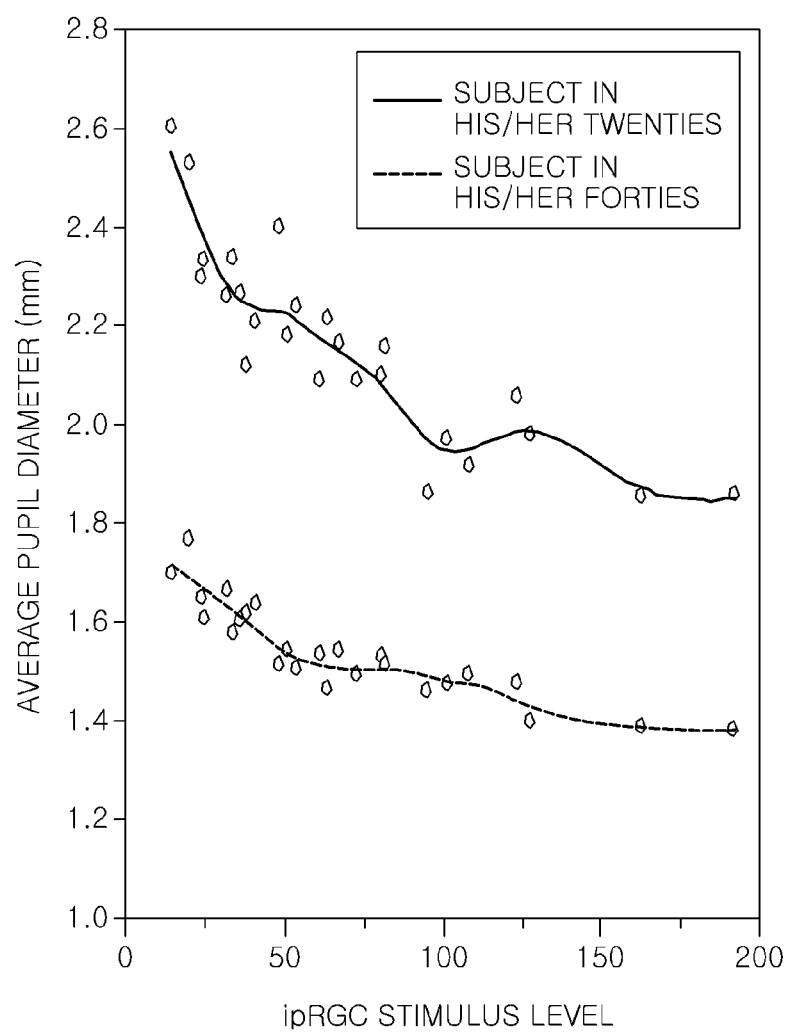
FIG. 9 is a view showing a relationship between an ipRGC stimulus level and an average pupil diameter.

As shown in FIG. 9, the average pupil diameters depicted in FIGS. 6A and 6B have been plotted about the ipRGC stimulus level calculated as above. As a result, it has been found that the average pupil diameter decreases as the ipRGC stimulus level increases.

Figure 10:
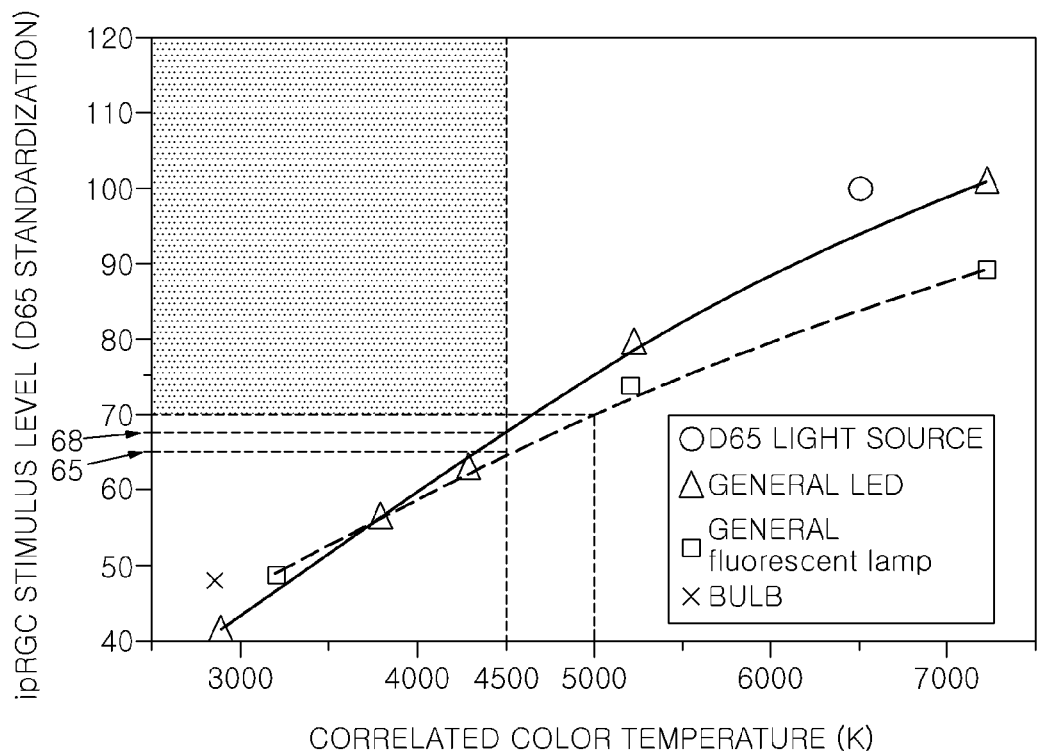
FIG. 10 is a view showing a relationship between a correlated color temperature and an ipRGC stimulus level.

Next, as shown in FIG. 10, the ipRGC stimulus level was calculated with respect to light irradiated from various existing light sources (at the illuminance of 1000 lx). A general LED, a fluorescent lamp and a bulb were used as the existing light sources and they were standardized such that an ipRGC stimulus level by light emitted from a standard light source D65 becomes 100. As a result, it has been found that light having the correlated color temperature of 4500 K irradiated from each of the general LED and the general fluorescent lamp provides the ipRGC stimulus levels of 68 and 65, respectively. Further, it has been found that the bulb provides the ipRGC stimulus level of 50 or less. In other words, it has been found that there are no existing light sources providing the ipRGC stimulus level of 70 or more at the correlated color temperature of 4500 K or less.

A general-purpose task lamp that has been conventionally popularized emits light having the correlated color temperature of about 5000 K. From FIG. 10, it has been found that such light gives the ipRGC stimulus level of about 70. Accordingly, when the correlated color temperature is 4500 K, if a light gives the ipRGC stimulus level of 70 or more (region indicated by dots), the average pupil diameter can be set to be almost the same as that of the general-purpose task lamp. Herein, the pupil diameter has a function similar to the aperture of a camera and when the pupil is constricted, a range in focus widens (depth of field increases). For this reason, to improve the character appearance in a low color temperature environment, it is required to allow the average pupil diameter to be almost the same as that of the general-purpose task lamp.

In the "character appearance white tone enhancement region" shown in FIG. 5, in order to acquire light providing the ipRGC stimulus level of 70 or more, a simulation was performed by using as parameters a peak wavelength of 420 to 660 nm (10 nm interval) and a half width of 20, 30 and 40 nm in a virtual light-emitting spectrum (Gauss distribution).

Figure 11:
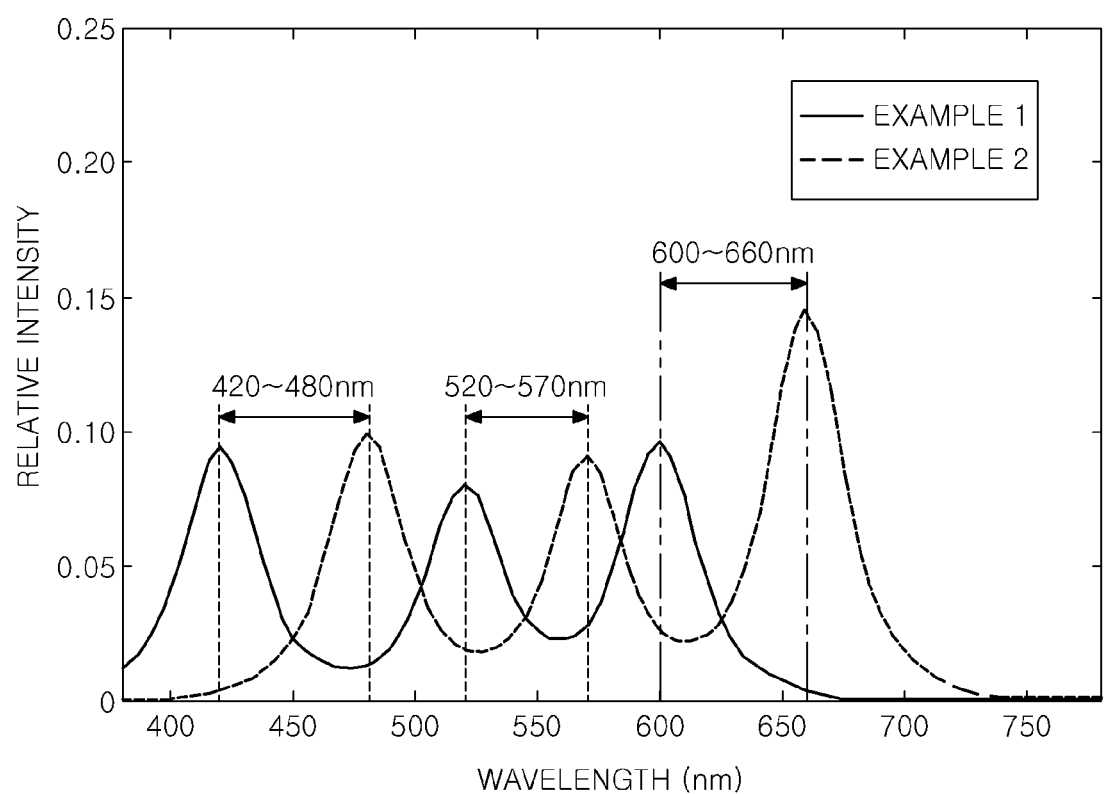
FIG. 11 is a spectrum distribution diagram of light (3 peak wavelengths) obtained by a simulation.

FIG. 11 illustrates examples of a spectrum distribution curve of light (three peak wavelengths) acquired by the above simulation. A light of Example 1 has peak wavelengths at 420 nm, 520 nm and 600 nm. A light of Example 2 has peak wavelengths at 480 nm, 570 nm and 660 nm.

As shown in Table 1, when the correlated color temperature and Duv of the light of Example 1 were set to 4500 K and −1.6, respectively, the ipRGC stimulus level was 73 and Ra (general color rendering index) was 84. When the correlated color temperature and Duv of the light of Example 2 were set to 4500 K and −1.6, respectively, the ipRGC stimulus level was 91 and Ra was 81. The light having the peak wavelengths in respective wavelength bands between 420 and 480 nm, between 520 and 570 nm, and between 600 and 660 nm has a high ipRGC stimulus level of 70 or more even though the correlated color temperature is low.

TABLE 1

|  | Correlated color temp. | Duv | ipRGC stimulus level | Ra | Peak Wavelength 1 | Peak Wavelength 2 | Peak Wavelength 3 |
| --- | --- | --- | --- | --- | --- | --- | --- |
| Example 1 | 4500 K | −1.6 | 73 | 84 | 420 nm | 520 nm | 600 nm |
| Example 2 | 4500 K | −1.6 | 91 | 81 | 480 nm | 570 nm | 660 nm |

Figure 12:
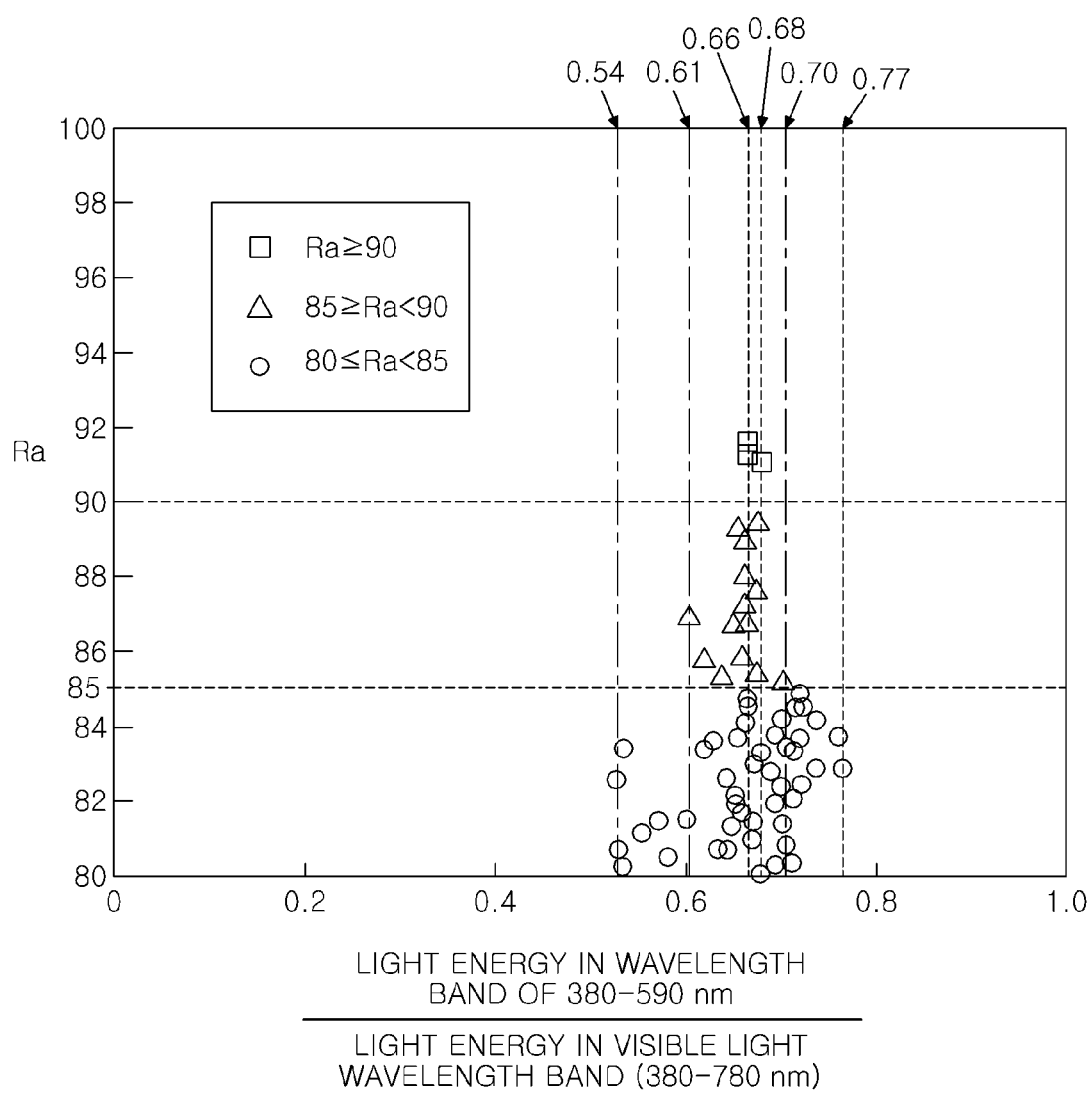
FIG. 12 is a view showing a relationship between Ra and a ratio of a light energy of the light in a wavelength band between 380 and 590 nm to a light energy of the light in a visible light wavelength band.

FIG. 12 shows a graph in which, in the light acquired by the above simulation, Ra is plotted with respect to a ratio of a light energy in a wavelength band between 380 and 590 nm to a light energy in a visible light wavelength band (between 380 and 780 nm). When Ra was equal to or larger than 80, the ratio was between 0.54 and 0.77; when Ra was equal to or larger than 85, the ratio was between 0.61 and 0.70; and when Ra was equal to or larger than 90, the ratio was between 0.66 and 0.68.

Figure 13:
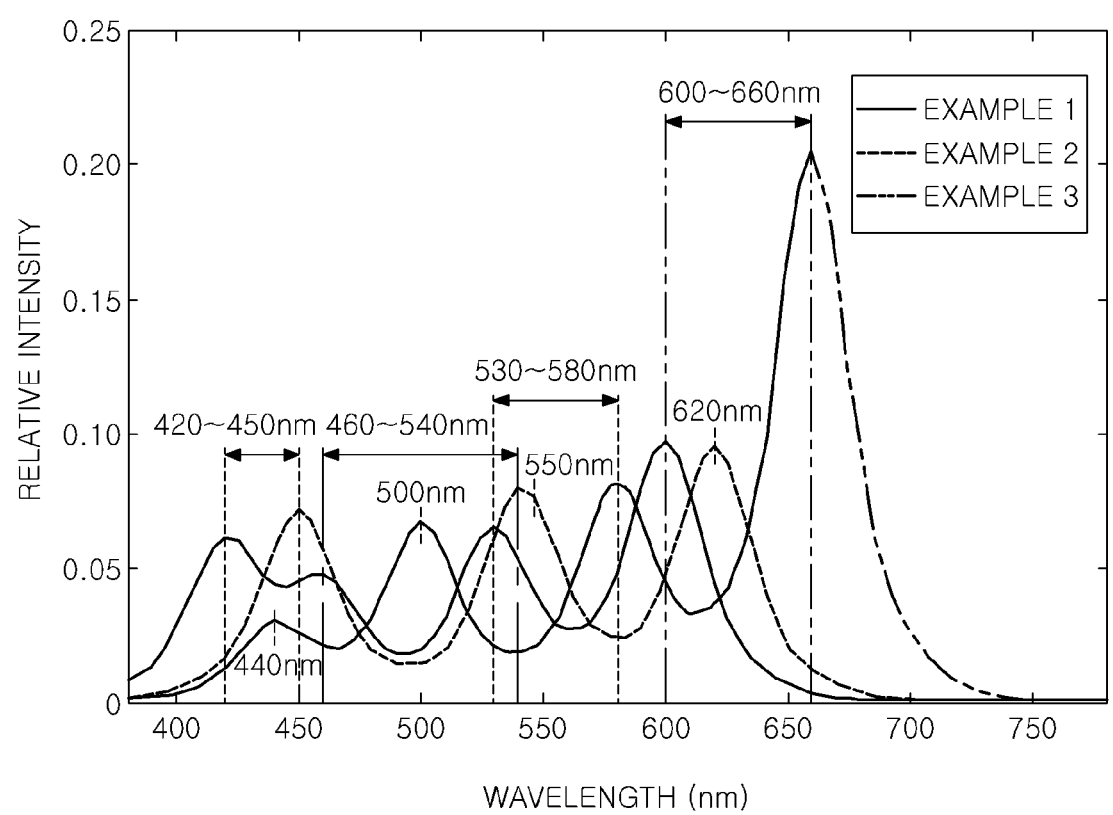
FIG. 13 is a spectrum distribution diagram of light (4 peak wavelengths) obtained by a simulation.

FIG. 13 illustrates examples of a spectrum distribution curve of light (four peak wavelengths) acquired by the above simulation. A light of Example 1 has peak wavelengths at 420 nm, 460 nm, 530 nm and 600 nm. A light of Example 2 has peak wavelengths at 450 nm, 540 nm, 550 nm and 620 nm. A light of Example 3 has peak wavelengths at 440 nm, 500 nm, 580 nm and 660 nm.

As shown in Table 2, when the correlated color temperature and Duv of the light of Example 1 were set to 4500 K and −12, respectively, the ipRGC stimulus level was 73 and Ra was 85. When the correlated color temperature and Duv of the light of Example 2 were set to 4500 K and −12, respectively, the ipRGC stimulus level was 70 and Ra was 82. When the correlated color temperature and Duv of the light of Example 3 were set to 3000 K and −1.6, respectively, the ipRGC stimulus level was 70 and Ra was 85. Therefore, the light having the peak wavelengths in respective wavelength bands between 420 and 450 nm, between 460 and 540 nm, between 530 and 580 nm, and between 600 and 660 nm has a high ipRGC stimulus level of 70 or more even though the correlated color temperature is low.

TABLE 2

|  | Correlated color temperature | Duv | ipRGC stimulus level | Ra | Peak Wavelength 1 | Peak Wavelength 2 | Peak Wavelength 3 | Peak Wavelength 4 |
| --- | --- | --- | --- | --- | --- | --- | --- | --- |
| Ex. 1 | 4500 K | −12 | 73 | 85 | 420 nm | 460 nm | 530 nm | 600 nm |
| Ex. 2 | 4500 K | −12 | 70 | 82 | 450 nm | 540 nm | 550 nm | 620 nm |
| Ex. 3 | 3000 K | −1.6 | 70 | 85 | 440 nm | 500 nm | 580 nm | 660 nm |

Figure 14:
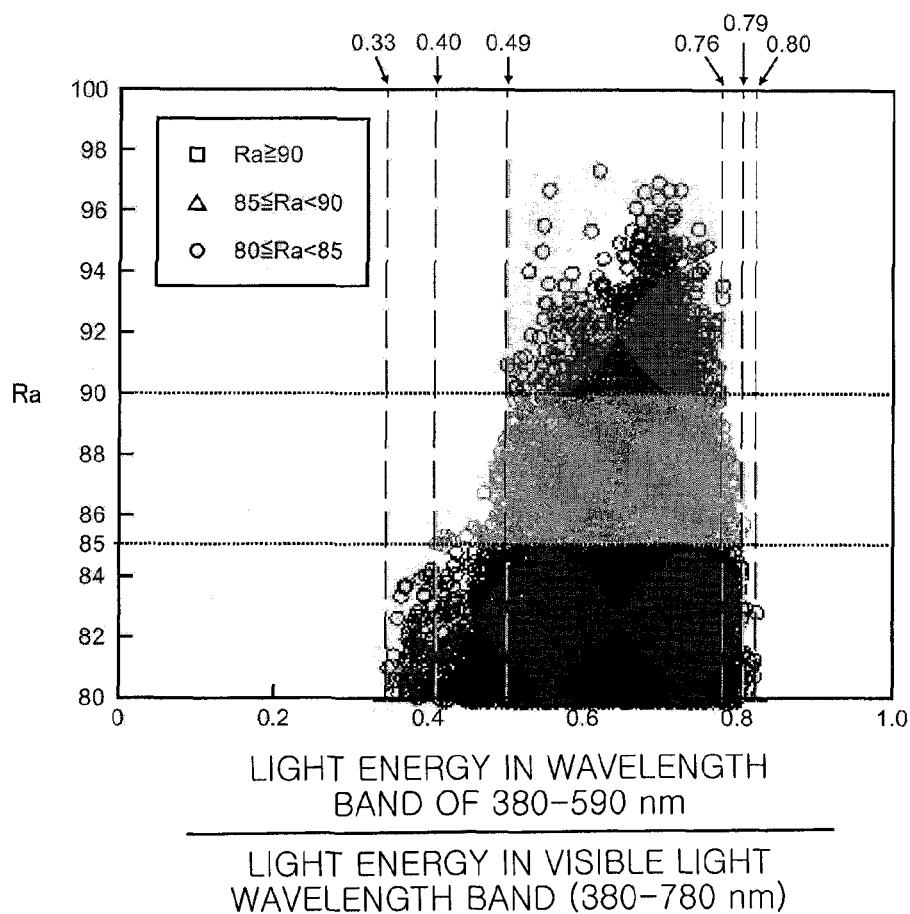
FIG. 14 is a view showing a relationship between Ra and a ratio of a light energy of the light in a wavelength band between 380 and 590 nm to a light energy of the light in a visible light wavelength band.

FIG. 14 shows a graph in which, in the light (four peak wavelengths) acquired by the above simulation, Ra is plotted with respect to a ratio of a light energy in a wavelength band between 380 and 590 nm to a light energy in a visible light wavelength band (between 380 and 780 nm). When Ra was equal to or larger than 80, the ratio was between 0.33 and 0.80; when Ra was equal to or larger than 85, the ratio was between 0.40 and 0.79; and when Ra was equal to or larger than 90, the ratio was between 0.49 and 0.76.

As shown in Tables 1 and 2, in the luminaire 1, light having the correlated color temperature of 3000 K to 4500 K, chromaticity deviation Duv of −1.6 to −12, and the general color rendering index Ra of 80 or more can be irradiated. Such light has a low correlated color temperature and has an effect of making a paper on which characters are written look white. Accordingly, when the luminaire 1 is used in a low color temperature environment, the luminaire 1 can irradiate illumination light under which a user hardly feels a sense of discomfort and characters are easily legible. Since the illumination light from the luminaire 1 is configured to have the ipRGC stimulus level of 70 or more, a pupil diameter efficiently constricts to thereby widen a range in focus (increase depth of field) and enhance legibility.

It is preferable that the ipRGC stimulus level is equal to or greater than 75. If Ra is equal to or greater than 80, it is preferable to use light having a high ipRGC stimulus level. Although not shown in the drawings, the luminaire 1 can also irradiate light having the correlated color temperature of 2600 K, chromaticity deviation Duv of −1.6 to −12, and the general color rendering index Ra of 80 or more. Here, the correlated color temperature of 2600 K is the lowest correlated color temperature of a bulb color in chromaticity classification of a white light source defined by JISZ9112-2012.

Next, in order to obtain an actual light giving the ipRGC stimulus level of 70 or more in the "character appearance white tone enhancement region" shown in FIG. 5, a simulation was performed by combining a blue LED emitting blue light having a peak wavelength in a wavelength band between 450 and 490 nm and an actual fluorescent substance excited by the blue light. As the actual fluorescent substance, 19 kinds of green/yellow fluorescent substances which radiate light in a wavelength band between 500 and 580 nm and 6 kinds of red fluorescent substances which radiate light in a wavelength band between 570 and 665 nm were used.

Figure 15:
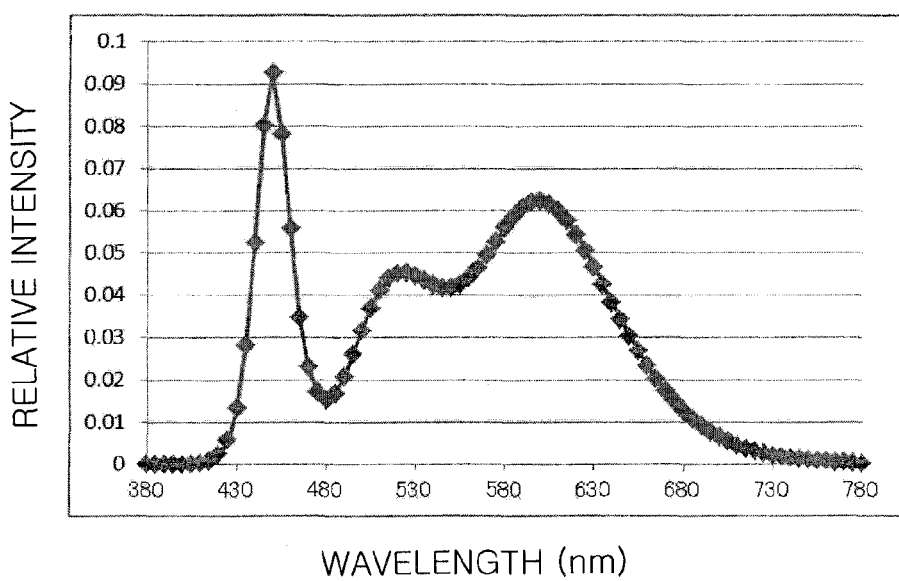
FIG. 15 is a spectrum distribution diagram of light obtained by a simulation based on an actual fluorescent substance.

FIG. 15 shows an example of a spectrum distribution curve of light acquired by the above simulation. The light has peak wavelengths in respective wavelength bands between 440 and 490 nm, between 500 and 580 nm, and between 570 and 665 nm. The ratio of a light energy in a wavelength band between 380 and 590 nm to a light energy in a visible light wavelength band was between 0.35 and 0.68.

Figure 16:
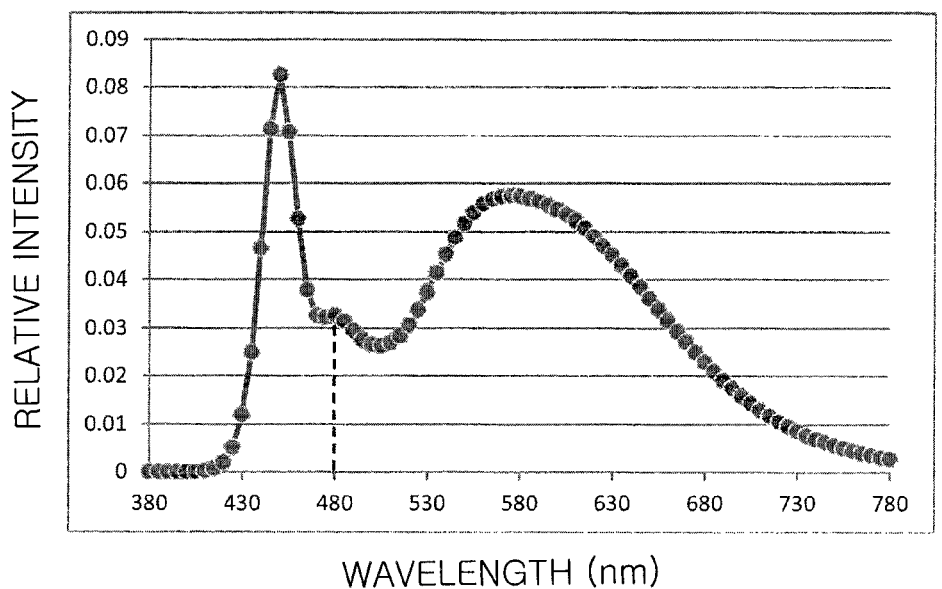
FIG. 16 is a spectrum distribution diagram of white light from a general-purpose LED added with a blue light having a peak wavelength of 480 nm.

FIG. 16 shows a calculation result of a simulation test in which blue light having peak wavelength at 480 nm is added to white light emitted from a general white LED to further increase ipRGC stimulus level. The white light herein includes blue light near a peak wavelength of 450 nm which is effective in increasing light-emitting efficiency.

Figure 17:
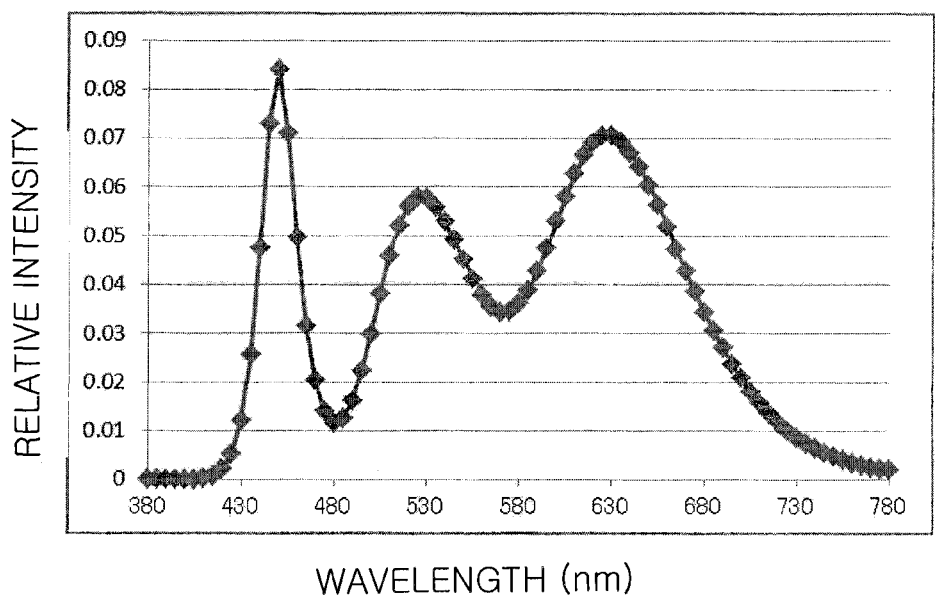
FIG. 17 is a spectrum distribution diagram of light obtained by combining the general-purpose white LED and a filter having an absorption band at a wavelength of about 580 nm.

FIG. 17 shows an example of a spectrum distribution curve of illumination light acquired by combining the above-described general white LED with a filter having an absorption band at about 580 nm. This light has peak wavelengths in respective wavelength bands between 440 and 460 nm, between 500 and 550 nm, and between 580 and 665 nm. The ratio of a light energy in a wavelength band between 380 and 590 nm to a light energy in a visible light wavelength band was between 0.42 and 0.67.

As such, by providing an absorption band at about 580 nm, for example, a spectrum of 2 peaks obtained by combining blue LED and one kind of fluorescent substance can be converted into a spectrum of 3 peaks. Therefore, it is possible to obtain light having Ra of 80 or more and ipRGC stimulus level of 70 or more by using a low-cost fluorescent substance. Such light decreases chroma level to increase whiteness of a paper and PS (preference index of skin color), thereby making appearance of a skin look good.

The above filter having an absorption band at about 580 nm is made by adding wavelength selective absorption coloring to the whole or some part of a light-transmitting resin. The wavelength selective absorption coloring selectively absorbs light in a wavelength band between 570 and 600 nm or between 570 and 780 nm. As for the wavelength-selective absorption coloring, there may be, e.g., things including, as a main agent, an organic compound such as tetraazaporphyrin, tetraphenylporphyrin, octaethylporphyrin, phthalocyanine, cyanin, azo, pyrromethene, squarylium, xanthenes, dioxane, oxonol and the like, or things including, as a main agent, an organic compound containing rare-earth metal ions such as neodymium ions. Among these, particularly, tetraazaporphyrin can be used very suitably since it has a high rigidity to light. Further, the filter is installed, e.g., at a light-emitting surface of the light-transmitting member. Furthermore, the filter has an absorption band at about 580 nm in the example of FIG. 17, but the same effect can be obtained even when the filter has an absorption band between 580 and 600 nm.

To sum up the above results, it is preferable that light irradiated from the luminaire 1 has at least two peak wavelengths in a wavelength band between 420 and 580 nm, and at least one peak wavelength in a wavelength band between 570 and 665 nm.

The luminaire according to the present disclosure can be variously modified without being limited to the above embodiments. For example, the light source unit is not limited to the above-described configuration and may be formed by combining blue LED, green LED and red fluorescent substance, by combining blue LED, green fluorescent substance and red LED, by combining blue LED, green LED and red LED, or by combining ultraviolet LED and blue, green and red fluorescent substances excited by the ultraviolet light. Further, the light source unit is not limited to the LEDs and may be formed by organic EL (electroluminescent) elements.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A luminaire, comprising:
   a light source configured to irradiate light having a correlated color temperature between 2600 K and 4500 K, a chromaticity deviation Duv between −1.6 and −12, and a general color rendering index Ra of 80 or more, wherein the light source irradiates the light to have an intrinsic photosensitive retinal ganglion cell (ipRGC) stimulus level of 70 or more, wherein the ipRGC stimulus level is a value standardized by setting an ipRGC stimulus level of light irradiated from a D65 light source to 100.

2. The luminaire of claim 1, wherein the light has at least two peak wavelengths in a wavelength band between 420 and 580 nm, and at least one peak wavelength in a wavelength band between 570 and 665 nm.

3. The luminaire of claim 1, wherein the light has three peak wavelengths in respective wavelength bands between 420 and 480 nm, between 520 and 570 nm, and between 600 and 660 nm.

4. The luminaire of claim 3, wherein a ratio of a light energy in a wavelength band between 380 and 590 nm of the light to a light energy in a wavelength band between 380 and 780 nm of the light is between 0.54 and 0.77.

5. The luminaire of claim 3, wherein a ratio of a light energy in a wavelength band between 380 and 590 nm of the light to a light energy in a wavelength band between 380 and 780 nm of the light is between 0.61 and 0.70.

6. The luminaire of claim 3, wherein a ratio of a light energy in a wavelength band between 380 and 590 nm of the light to a light energy in a wavelength band between 380 and 780 nm of the light is between 0.66 and 0.68.

7. The luminaire of claim 1, wherein the light has four peak wavelengths in respective wavelength bands between 420 and 450 nm, between 460 and 540 nm, between 530 and 580 nm, and between 600 and 660 nm.

8. The luminaire of claim 7, wherein a ratio of a light energy in a wavelength band between 380 and 590 nm of the light to a light energy in a wavelength band between 380 and 780 nm of the light is between 0.33 and 0.80.

9. The luminaire of claim 7, wherein a ratio of a light energy in a wavelength band between 380 and 590 nm of the light to a light energy in a wavelength band between 380 and 780 nm of the light is between 0.40 and 0.79.

10. The luminaire of claim 7, wherein a ratio of a light energy in a wavelength band between 380 and 590 nm of the light to a light energy in a wavelength band between 380 and 780 nm of the light is between 0.49 and 0.76.

11. The luminaire of claim 1, wherein the light has three peak wavelengths in respective wavelength bands between 440 and 490 nm, between 500 and 580 nm, and between 570 and 665 nm.

12. The luminaire of claim 11, wherein a ratio of a light energy in a wavelength band between 380 and 590 nm of the light to a light energy in a wavelength band between 380 and 780 nm of the light is between 0.35 and 0.68.

13. The luminaire of claim 1, wherein the light has three peak wavelengths in respective wavelength bands between 440 and 460 nm, between 500 and 550 nm, and between 580 and 665 nm.

14. The luminaire of claim 13, wherein a ratio of a light energy in a wavelength band between 380 and 590 nm of the light to a light energy in a wavelength band between 380 and 780 nm of the light is between 0.42 and 0.67.

15. The luminaire of claim 1, further comprising:
a filter configured to absorb light in a wavelength band between 580 and 600 nm.

* * * * *